United States Patent [19]
Boudet et al.

[11] Patent Number: 5,822,168
[45] Date of Patent: Oct. 13, 1998

[54] ELECTRONIC RELAY

[75] Inventors: Pierre Boudet, Jouy Le Moutier; Joël Jaca, Osny; Jean-Marc Romillon, Longnes, all of France

[73] Assignee: Schneider Electric SA, Boulogne Billancourt, France

[21] Appl. No.: 787,965

[22] Filed: Jan. 23, 1997

[30] Foreign Application Priority Data

Jan. 26, 1996 [FR] France ................................ 96 01117

[51] Int. Cl.$^6$ ........................................... H01H 47/28
[52] U.S. Cl. .................................. 361/187; 361/794
[58] Field of Search ............................ 361/161, 165, 361/170, 187, 792, 794, 795, 729, 735, 736, 819, 824; 364/483, 489, 491

[56] References Cited

U.S. PATENT DOCUMENTS

| | | | |
|---|---|---|---|
| 4,713,718 | 12/1987 | Quayle | 361/29 |
| 5,390,081 | 2/1995 | St. Pierre | 361/775 |
| 5,557,506 | 9/1996 | Wood et al. | 361/796 |

FOREIGN PATENT DOCUMENTS

| | | |
|---|---|---|
| 0 214 025 | 3/1987 | European Pat. Off. . |
| WO 81/01092 | 4/1981 | WIPO . |

OTHER PUBLICATIONS

Michael BABB, "Low–Cost Motor Protection Becomes Reality in the 1990s", Control Engineering, vol. 41, No.13, (1994), pp. 43–45.

*Primary Examiner*—Jeffrey A. Gaffin
*Assistant Examiner*—Michael J. Sherry
*Attorney, Agent, or Firm*—Oblon, Spivak, McClelland, Maier & Neustadt, P.C.

[57] ABSTRACT

An electronic relay including current sensors (11, 12, 13) mounted, between terminals (L1, T1, L2, T2, L31, T3), in series on alternating current power supply lines to a load (M). A back of a case (1) of the electronic relay includes a power card (C1) linked to the current sensors (11, 12, 13) and connected via connectors to electronic daughter cards (C2, C3, C4) carrying lateral terminal blocks (B1 and B2) which have outputs in the lateral openings of the case. A front of the case (1) includes a dialogue and communication card (C5) connected to at least one of the daughter cards (C3).

7 Claims, 4 Drawing Sheets

ELECTRONIC RELAY

BACKGROUND OF THE INVENTION

1. Field of the Invention

This invention relates to a multifunction protective electronic relay including current sensors mounted in series on alternating current supply lines to a load such as a multiphase electric motor.

2. Discussion of the Background

Protective electronic relays with a microprocessor, of the type described in patent EP 0214025 exist. This type of relay can ensure detection and protection functions in the following cases: thermal overload, temperature overshoot, phases absent or out of balance, phase reversals, insulation to earth defects, excessive torque cut-off, running with no load. The sensors situated on each of the power supply phases supply the relay with signals that represent the phase currents. From these signals, the relay can calculate the temperature rise of the windings and of the motor, can detect phase anomalies, etc. Such a device is fitted with separate output relays which allow the alarm or defect information to be utilized. Display of the thermal condition of the motor and of defects is carried out by means of indicator lamps located on the front face or on a remote display module.

However, these relays are mounted in an ordinary case requiring internal wiring.

SUMMARY OF THE INVENTION

Accordingly, one object of this invention is to provide an electronic relay layout that avoids internal wiring and facilitates construction thereof.

In accordance with the invention, the relay is characterised by the fact that it includes at the rear of the case, a power card linked to current sensors and connected by connectors to electronic daughter cards which have lateral terminals with outputs in the lateral openings in the case and, at the front of the case, a dialogue and communication card that is connected to at least one of the daughter cards.

According to one characteristic, the daughter cards are mounted in the case perpendicular to the power card, the display and communication card being mounted perpendicular to the daughter cards and being connected to the card positioned in the centre.

A more complete appreciation of the invention and many of the attendant advantages thereof will be readily obtained as the same becomes better understood by reference to the following detailed descriptions when considered in connection with the accompanying drawing, wherein.

Figure 1:
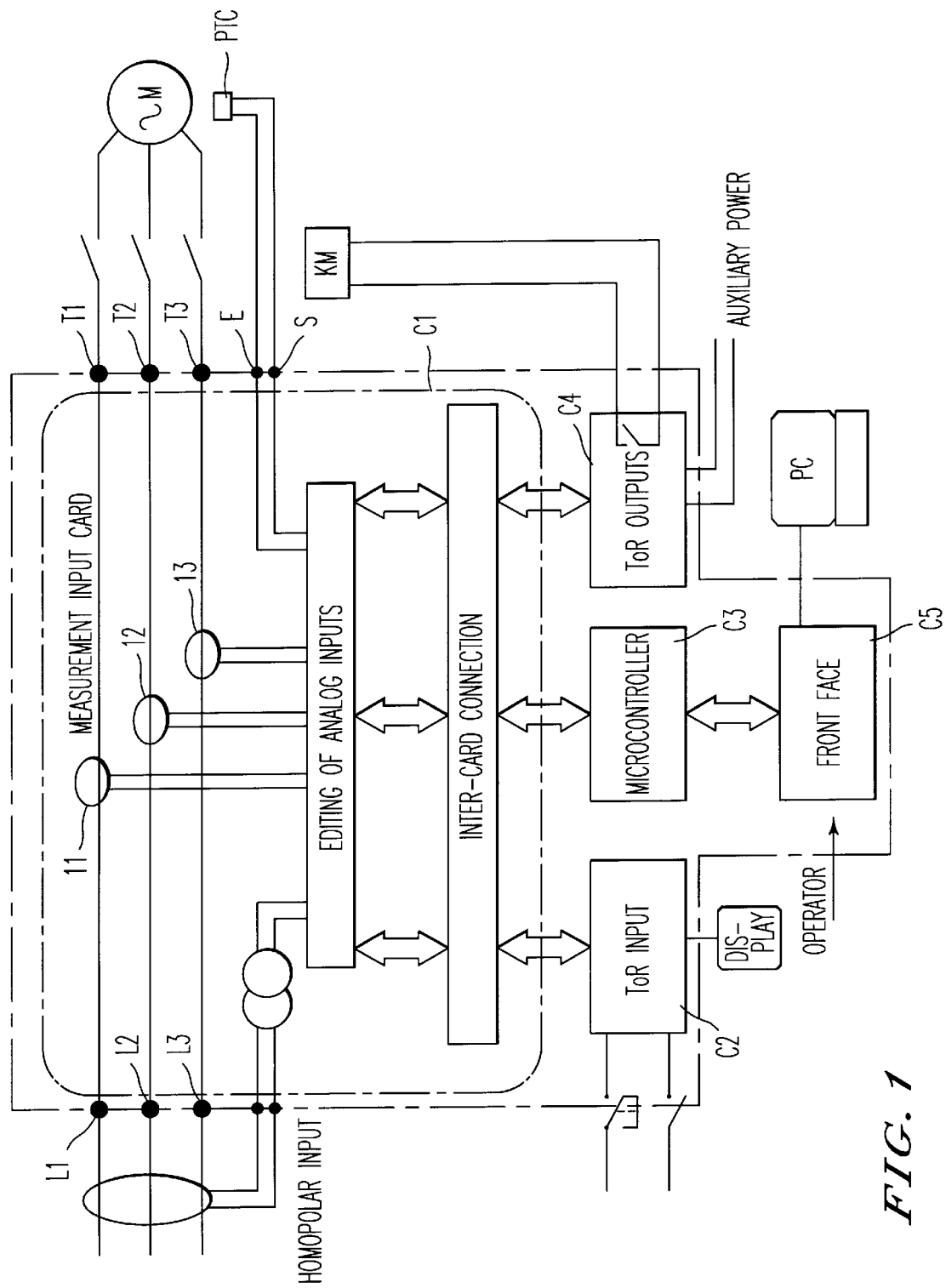
FIG. 1 is a block diagram of the electronic relay according to the invention.
Figure 2:
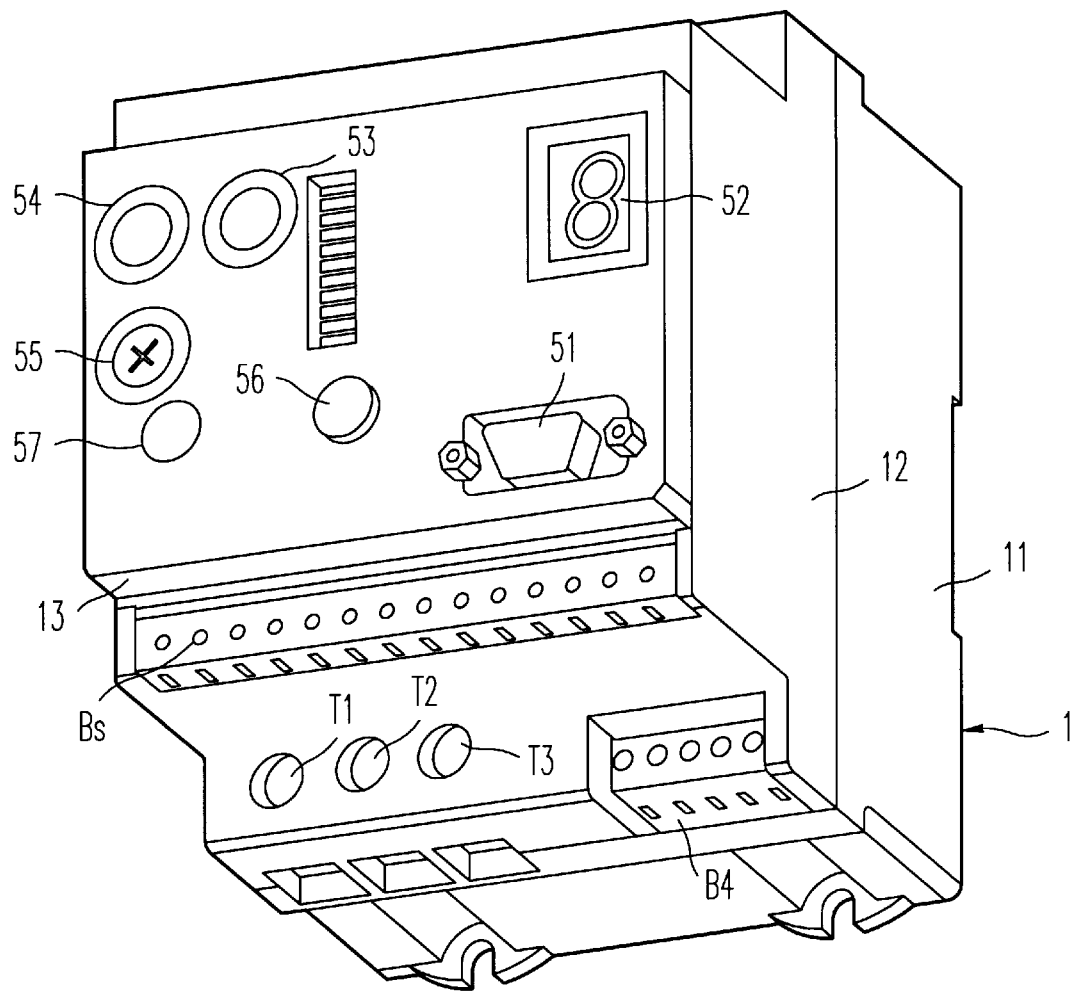
FIG. 2 is a perspective view of the relay.
Figure 3:
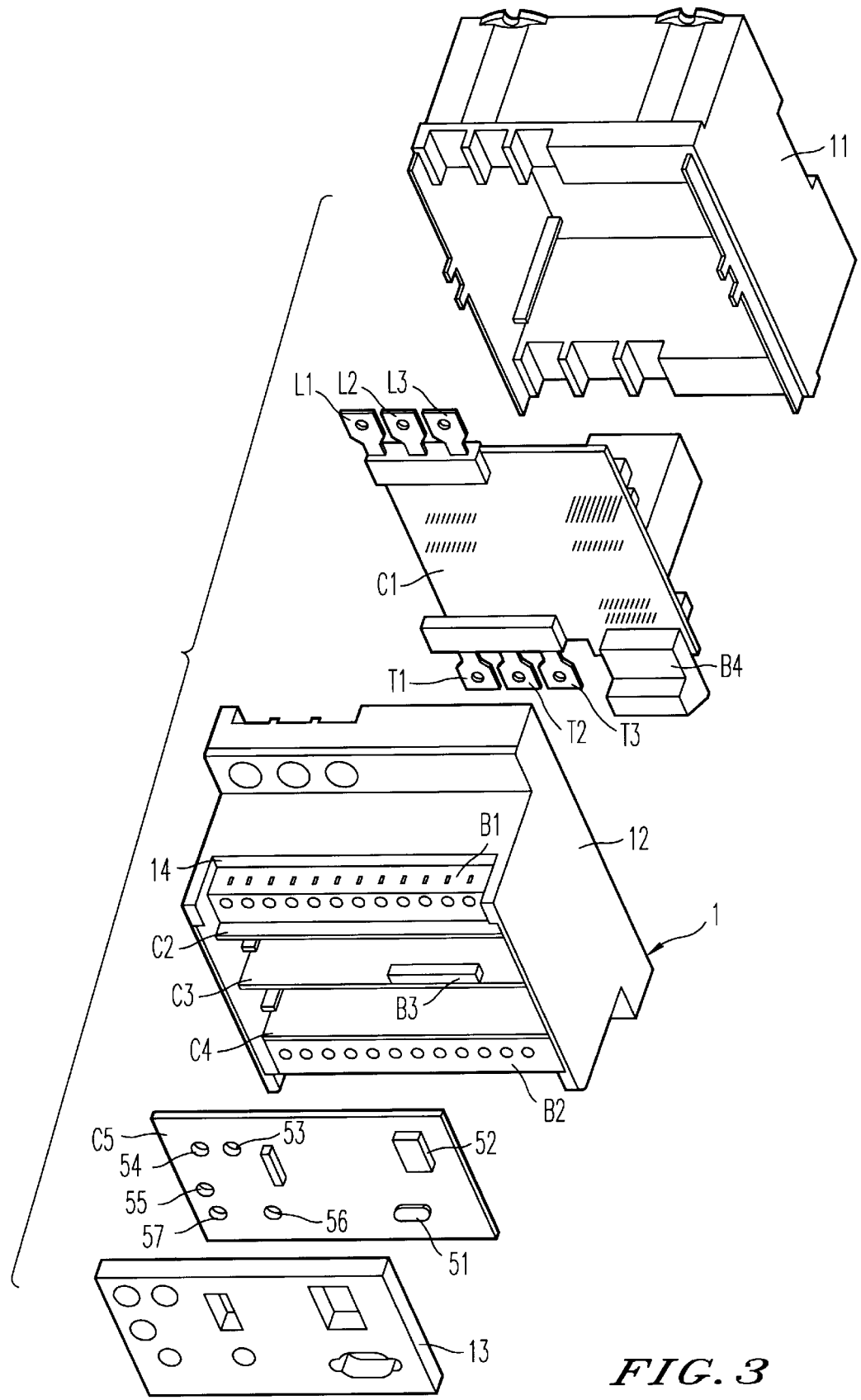
FIG. 3 is an exploded perspective view of the relay.
Figure 4:
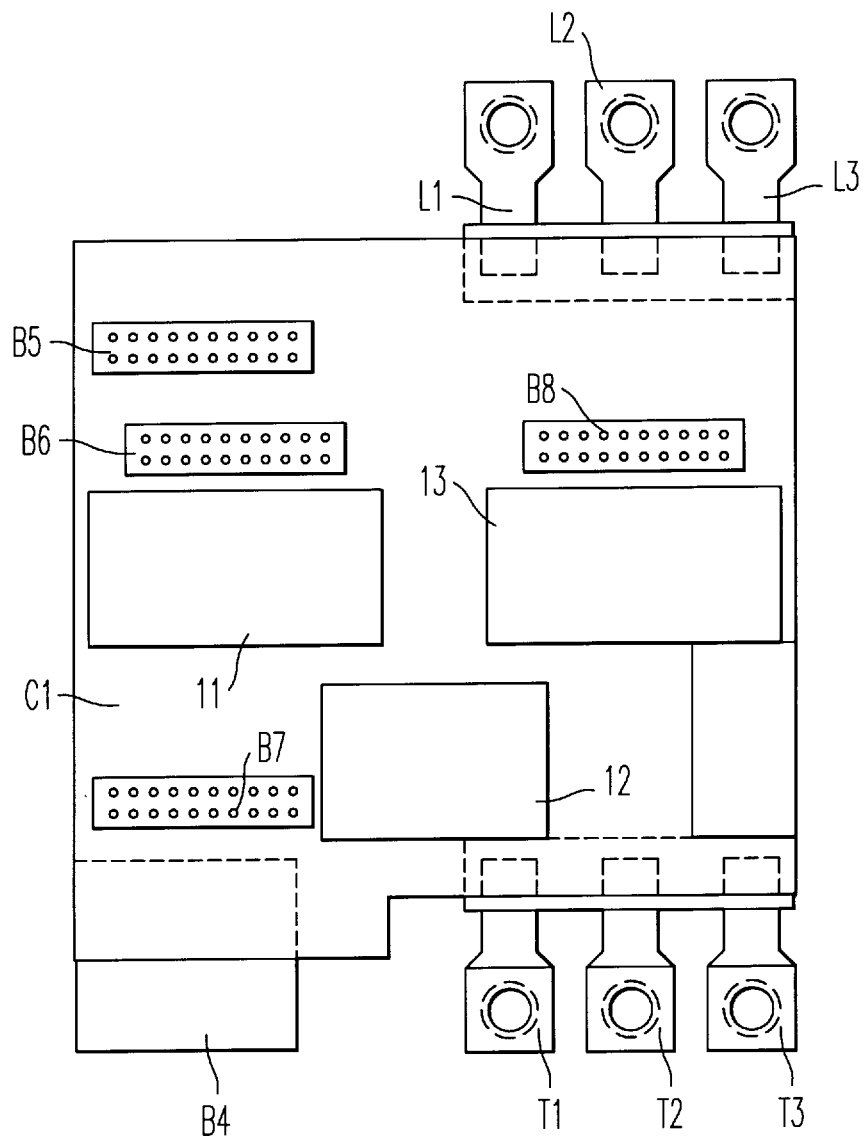
FIG. 4 is a view of the back of the power card.

Referring now to the drawings, wherein like reference numerals designated identical or corresponding parts throughout the several views, and more particularly in FIG. 1 thereof, there is illustrated an electronic relay including terminals L1, L2, L3 connected to the alternating current power supply lines and the terminals T1, T2, T3 connected to a load, for example, to a motor M. Terminals E and S can be connected to a PTC probe of the temperature sensor type allowing thermal control of the motor.

The case marked 1 in its entirety, is made up of a rear mounting base 11 capable of being fixed to a support (a rail, for example), a box 12 which can be assembled on the mounting base 11 and a front cover 13. It contains a power card C1, an input card C2, a processing card C3, an output card C4 and a dialogue and communication card C5.

The power card C1 is housed at the back, on the mounting base 11 of the case and receives all the analog inputs, (currents from the three phases, PTC probe input, inputs from a homopolar magnetic core) and makes these analog inputs compatible with the inputs of the microcontroller. The card is fitted with a terminal block B4 that allows connection of the analog inputs (homopolar input, PTC probe) and it makes the interconnection with the other cards of the relay by means of removable pin connectors B5, B6, B7, B8. It is fitted with current sensors or transformers 11, 12, 13 which are mounted on the mounting base 11 opposite openings that allow the passage of external wires. The power card C1 can include, at the side of terminals L1, L2 L3, extra terminals suited to different scales of current intensity. In order to keep the drawings simple, only terminals L1, L2 and L3 have been shown.

The input card C2 is housed in the upper part of the case and receives all the logic inputs and makes these logic inputs compatible with the logic inputs of the microcontroller. It is fitted, at the back, with a removable pin connector that connects it at B5 to the power card C1 and, at the front with a terminal block B1 that provides connection of these logic inputs to the external environment. It supports connection and insulation of display circuits. It includes a communication circuit that allows it remote communication, through the use of terminal block B1, with display means located remote from the apparatus.

The processing card C3 is housed in the central part of the case, between the two other cards C2 and C4 and is fitted with a microcontroller. It receives all the logic and analog inputs and manages the outputs. It is fitted, at the rear, with a removable pin connector that connects it at B6, B8 to the power card C1 and, at the front, with a removable pin connector B3 providing connection with the dialogue and communication card C5.

The power supply and output card C4 is housed in the lower part of the case and is fitted with an output relay and the auxiliary power supply. It is fitted, at the back with a removable pin connector that connects it at B7 to the power card C1 and at the front with a terminal block B2 providing connection of the outputs and the power supply to the outside. Via the output relays, it controls a signalling output indicating tripping in the event of a thermal overload, an alarm output indicating if the thermal condition has reached a previously set threshold value, and motor command outputs that allow control of contactors such as a KM1.

The dialogue and communication card C5 is housed at the front of the case and is fitted with components that provide the machine dialogue and the serial connection. It is connected to the processing card C3 by a removable pin connector B3. It carries a serial connector 51 intended for communication with a bus or a computer, a display component 52 that allows the display of the cause of a trip, a first regulating device 53 allowing regulation of the nominal motor current, a second regulating device allowing regulation of the nominal motor current (the sum of the adjustments of 53 and 54 allowing determination of the nominal motor current), a device 55 for regulating the class of trip of the motor, a button 56 that allows to trip the apparatus (test) and a button 57 for resetting it.

The cards C2, C3, C4 are daughter cards assembled inside the case (in which they have slide bars to guide them) so that they are set perpendicular to the power card C1. The dialogue and communication card C5 is mounted on the front face, parallel to the power card C1. The lateral terminal blocks B1 and B2 are set parallel to the back face of the case with outputs to the outside in the lateral openings 14 of the case. The terminal block B4 also has an output to the outside via an opening in the case.

It is of course understood that, without departing from the scope of the invention, variants and means of perfecting the detail of the invention can be devised and the use of equivalent means can similarly be contemplated.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An electronic relay for coupling alternating power supply lines to a load, comprising:
   a case;
   current sensors provided between respective of the alternating current supply lines and the load;
   daughter cards;
   a power card provided at a rear of the case and linked to the current sensors and connected to the daughter cards; and
   a communication and dialogue card provided at a front of the case, connected to at least one of the daughter cards, for connecting to a computer.

2. An electronic relay according to claim 1, wherein the daughter cards are mounted in the case perpendicular to the power card, the dialogue and communication card is mounted perpendicular to the daughter cards and is connected to a center card of the daughter cards.

3. An electronic relay according to claim 1, wherein the case comprises a rear mounting base for fixing the case to a support, a box which is assembled on the rear mounting base and a front cover.

4. An electronic relay according to claim 1, wherein a first daughter card of the daughter cards is mounted laterally and fitted with a first terminal block and functions as a logic input card.

5. An electronic relay according to claim 1, wherein a second daughter card of the daughter cards is mounted laterally and fitted with a second terminal block and functions as an output card.

6. An electronic relay according to claim 1, wherein a third daughter card of the daughter cards is mounted between first and second daughter cards of the daughter cards, functions as processing card and is fitted with a microcontroller.

7. An electronic relay according to claim 1, wherein the dialogue and communication card is connected by a removable pin connector to a processing card of the daughter cards and has a communication connector for connecting to a bus or the computer.

* * * * *

UNITED STATES PATENT AND TRADEMARK OFFICE
CERTIFICATE OF CORRECTION

PATENT NO. : 5,822,168

DATED : October 13, 1998

INVENTOR(S): Pierre BOUDET et al.

It is certified that an error appears in the above-identified patent and that said Letters Patent is hereby corrected as shown below:

On the title page, item [75], the second Inventor's last name should read:

--Jacq--

Signed and Sealed this

Eighteenth Day of May, 1999

Attest:

Q. TODD DICKINSON

*Attesting Officer*  Acting Commissioner of Patents and Trademarks